(12) United States Patent
Li

(10) Patent No.: US 10,971,529 B2
(45) Date of Patent: Apr. 6, 2021

(54) ELECTRONIC DEVICE AND MANUFACTURING METHOD OF THE SAME

(71) Applicant: GIO Optoelectronics Corp., Tainan (TW)

(72) Inventor: Chin-Tang Li, Tainan (TW)

(73) Assignee: Gio Optoelectronics Corp., Tainan (TW)

( * ) Notice: Subject to any disclaimer, the term of this patent is extended or adjusted under 35 U.S.C. 154(b) by 0 days.

(21) Appl. No.: 16/449,929

(22) Filed: Jun. 24, 2019

(65) Prior Publication Data

US 2020/0006404 A1    Jan. 2, 2020

(30) Foreign Application Priority Data

Jun. 29, 2018  (TW) .................. 107122662
Mar. 5, 2019   (TW) .................. 108107174

(51) Int. Cl.
*H01L 25/16* (2006.01)
*H01L 27/12* (2006.01)
(Continued)

(52) U.S. Cl.
CPC ........ *H01L 27/1259* (2013.01); *H01L 25/167* (2013.01); *H01L 27/124* (2013.01); *H01L 27/3253* (2013.01); *H01L 27/3255* (2013.01); *H05K 1/118* (2013.01); *H05K 1/144* (2013.01); *H05K 3/125* (2013.01); *H05K 3/28* (2013.01);
(Continued)

(58) Field of Classification Search
CPC .............. H01L 27/1259; H01L 27/124; H01L 25/0753; H01L 25/167; Y02P 70/50; H05K 3/3485; H05K 3/125; H05K 3/321; H05K 1/141; H05K 1/181
See application file for complete search history.

(56) References Cited

U.S. PATENT DOCUMENTS 6,617,521 B1   9/2003  Saito et al.
2005/0105036 A1  5/2005  Murakami
(Continued)

FOREIGN PATENT DOCUMENTS

EP    3343273 A2   7/2018
EP    3422827 A1   1/2019
EP    3503182 A1   6/2019

*Primary Examiner* — Jarrett J Stark
(74) *Attorney, Agent, or Firm* — Muncy, Geissler, Olds & Lowe, P.C.

(57) ABSTRACT

An electronic device and manufacturing method of the electronic device are disclosed. The manufacturing method includes: providing a substrate; forming a thin film circuit on the substrate, wherein the thin film circuit comprises at least one thin film transistor and at least one conductive trace; forming at least one first connection pad on the substrate, wherein the first connection pad is electrically connected with the thin film transistor through the conductive trace; disposing the substrate on a driving circuit board, wherein the driving circuit board comprises at least one second connection pad adjacent to and corresponding to the first connection pad; and forming a conductive member covering at least a part of the second connection pad and the first connection pad, wherein the second connection pad is electrically connected with the first connection pad through the conductive member.

19 Claims, 14 Drawing Sheets

(51) Int. Cl.
*H01L 27/32* (2006.01)
*H05K 1/14* (2006.01)
*H05K 1/11* (2006.01)
*H05K 3/12* (2006.01)
*H05K 3/28* (2006.01)
*H01L 21/77* (2017.01)
*H01L 41/047* (2006.01)

(52) U.S. Cl.
CPC ...... *H01L 27/3248* (2013.01); *H01L 41/0475* (2013.01); *H01L 2021/775* (2013.01); *H05K 2201/09445* (2013.01); *H05K 2201/10977* (2013.01)

(56) References Cited

U.S. PATENT DOCUMENTS

| | | | | |
|---|---|---|---|---|
| 2007/0146425 | A1* | 6/2007 | Hong | B41J 2/15 347/40 |
| 2007/0257591 | A1* | 11/2007 | Park | H01J 11/44 313/112 |
| 2011/0180787 | A1* | 7/2011 | Cho | C09D 11/52 257/40 |
| 2012/0107978 | A1* | 5/2012 | Shin | H01L 51/003 438/29 |
| 2013/0148062 | A1* | 6/2013 | Liang | G02F 1/133512 349/110 |
| 2014/0353637 | A1* | 12/2014 | Kawata | H01L 51/0097 257/40 |
| 2016/0141549 | A1* | 5/2016 | Odaka | H01L 27/3276 257/40 |
| 2016/0161770 | A1* | 6/2016 | Joo | G02F 1/0102 359/241 |
| 2016/0202476 | A1* | 7/2016 | Chong | G02B 27/0961 359/743 |
| 2017/0294425 | A1* | 10/2017 | Kim | H01L 51/0097 |
| 2017/0301724 | A1 | 10/2017 | Lee | |
| 2017/0358562 | A1* | 12/2017 | Banna | H01L 25/0753 |
| 2018/0053810 | A1* | 2/2018 | Jin | G06F 3/04164 |
| 2018/0090398 | A1* | 3/2018 | Park | H01L 27/323 |
| 2018/0341155 | A1* | 11/2018 | Liu | G02F 1/1333 |
| 2019/0198490 | A1* | 6/2019 | Li | H01L 25/18 |
| 2019/0229160 | A1* | 7/2019 | Lee | H01L 27/3276 |
| 2020/0044188 | A1* | 2/2020 | Li | H01L 21/02266 |
| 2020/0110497 | A1* | 4/2020 | Jin | G06F 3/0412 |
| 2020/0168157 | A1* | 5/2020 | Kim | H05K 9/0084 |
| 2020/0185452 | A1* | 6/2020 | Chen | H01L 33/52 |
| 2020/0211477 | A1* | 7/2020 | Lai | H01L 27/3276 |
| 2020/0212021 | A1* | 7/2020 | Yueh | H01L 31/105 |
| 2020/0267842 | A1* | 8/2020 | Park | H05K 1/189 |

* cited by examiner

ELECTRONIC DEVICE AND MANUFACTURING METHOD OF THE SAME

CROSS REFERENCE TO RELATED APPLICATIONS

This Non-provisional application claims priority under 35 U.S.C. § 119(a) on Patent Application No(s). 107122662 filed in Taiwan, Republic of China on Jun. 29, 2018, and 108107174 filed in Taiwan, Republic of China on Mar. 5, 2019, the entire contents of which are hereby incorporated by reference.

BACKGROUND

Technology Field

The present disclosure relates to an electronic device and a manufacturing method thereof.

DESCRIPTION OF RELATED ART

In the conventional manufacture of an optoelectronic device, a plurality of thin film transistors are formed on a substrate to obtain a thin film transistor substrate, and then the corresponding optoelectronic element is driven by the thin film transistor. Taking an organic light-emitting diode display device, which driving the organic light-emitting diodes by the thin film transistors, as an example, if there are many different product sizes or functions, different thin film processes are designed for the corresponding organic light-emitting diode devices with different product sizes or functions. In addition, the conventional manufacturing methods adopt the expensive thin film transistor processes, photomasks, substrates and/or materials, which is very unfavorable for the various product requirements and is lack of flexibility in applications.

SUMMARY

The present disclosure is to provide, in one aspect, an electronic device and a manufacturing method thereof. This disclosure does not need to design different manufacturing processes for products with different sizes and functions, so that the manufacturing process of this disclosure is simpler and has lower cost. Moreover, this disclosure has flexibility in applications so as to be suitable for various product requirements.

One or more exemplary embodiments of this disclosure provides a manufacturing method of an electronic device, which comprises: providing a substrate, wherein the substrate comprises a first surface and a second surface opposite to each other; forming a thin film circuit on the first surface of the substrate, wherein the thin film circuit comprises at least one thin film transistor and at least one conductive trace; forming at least one first connection pad on the first surface of the substrate, wherein the first connection pad is electrically connected with the thin film transistor through the conductive trace; disposing the second surface of the substrate on a driving circuit board, wherein the driving circuit board comprises at least one second connection pad adjacent to and corresponding to the first connection pad; and forming a conductive member covering at least a part of the second connection pad and the first connection pad, wherein the second connection pad is electrically connected with the first connection pad through the conductive member.

In some embodiments, the substrate is a rigid board, or a flexible board formed on a rigid carrier.

In some embodiments, before the step of disposing the substrate on the driving circuit board, the manufacturing method further comprises: removing the rigid carrier.

In some embodiments, the conductive member is formed on at least the part of the second connection pad and the first connection pad by jet printing or coating.

In some embodiments, after the step of forming the thin film circuit on the substrate, the manufacturing method further comprises: forming a protection layer to cover the thin film circuit.

In some embodiments, the manufacturing method further comprises: disposing a surface mounted element on the driving circuit board, wherein the driving circuit board further comprises at least one third connection pad, and the surface mounted element is electrically connected with the thin film transistor through the second connection pad and is electrically connected with the driving circuit board through the third connection pad.

In some embodiments, the manufacturing method further comprises: forming at least one fourth connection pad on the first surface of the substrate, wherein the fourth connection pad is electrically connected with the thin film transistor through the conductive trace; and disposing a surface mounted element on the first surface of the substrate, wherein the surface mounted element is electrically connected with the thin film transistor through the fourth connection pad.

In some embodiments, the manufacturing method further comprises: forming at least one fourth connection pad on the first surface of the substrate, wherein the fourth connection pad is electrically connected with the thin film transistor through the conductive trace; and disposing at least one functional chip on the first surface of the substrate, wherein the functional chip is electrically connected with the thin film transistor through the fourth connection pad.

In some embodiments, the manufacturing method further comprises: forming a protection layer to cover the thin film circuit and the functional chip.

In some embodiments, the manufacturing method further comprises: disposing a plurality of the substrates on the driving circuit board in an array, wherein each of the substrates comprises a plurality of the thin film circuits and a plurality of the first connection pads, each of the thin film circuits is electrically connected with corresponding ones of the first connection pads, the driving circuit board comprises a plurality of the second connection pads, a plurality of the conductive members are formed, and one of the first connection pads corresponding to one of the thin film circuits and one of the second connection pads of the driving circuit board are electrically connected through one of the conductive members; and electrically connecting two of the thin film circuits disposed on adjacent two of the substrates through the connection among two of the first connection pads, at least one of the second connection pads corresponding to the two first connection pads, and two of the conductive members respectively corresponding to the two first connection pads.

In some embodiments, the manufacturing method further comprises: disposing a plurality of the substrates on the driving circuit board in an array, wherein each of the substrates comprises a plurality of the thin film circuits and a plurality of the first connection pads, each of the thin film circuits is electrically connected with corresponding ones of the first connection pads, the driving circuit board comprises a plurality of the second connection pads, a plurality of the conductive members are formed, and one of the first connection pads corresponding to one of the thin film circuits and one of the second connection pads of the driving circuit board are electrically connected through one of the conductive members; and electrically connecting two of the thin film circuits disposed on adjacent two of the substrates through the connection among two of the first connection pads, at least one of the second connection pads corresponding to the two first connection pads, and one of the conductive members corresponding the two first connection pads.

One or more exemplary embodiments of the present disclosure further provides an electronic device, which comprises a substrate, a thin film circuit, at least one first connection pad, a driving circuit board and a conductive member. The substrate comprises a first surface and a second surface opposite to each other. The thin film circuit is disposed on the first surface of the substrate, and the thin film circuit comprises at least one thin film transistor and at least one conductive trace. The first connection pad is disposed on the first surface of the substrate, and the first connection pad is electrically connected with the thin film transistor through the conductive trace. The driving circuit board comprises at least one second connection pad. The second surface of the substrate is disposed on a driving circuit board, and the second connection pad is adjacent to and corresponding to the first connection pad. The conductive member covers at least a part of the second connection pad and the first connection pad, and the second connection pad is electrically connected with the first connection pad through the conductive member.

In some embodiments, the substrate is a rigid board or a flexible board.

In some embodiments, the electronic device further comprises a protection layer covering the thin film circuit.

In some embodiments, the electronic device further comprises a surface mounted element disposed on the driving circuit board, and the driving circuit board further comprises at least one third connection pad. The surface mounted element is electrically connected with the thin film transistor through the second connection pad and is electrically connected with the driving circuit board through the third connection pad.

In some embodiments, the electronic device further comprises at least one fourth connection pad and a surface mounted element. The fourth connection pad is disposed on the first surface of the substrate, and the fourth connection pad is electrically connected with the thin film transistor through the conductive trace. The surface mounted element is disposed on the first surface of the substrate, and the surface mounted element is electrically connected with the thin film transistor through the fourth connection pad.

In some embodiments, the electronic device further comprises at least one fourth connection pad and at least one functional chip. The fourth connection pad is disposed on the first surface of the substrate, and the fourth connection pad is electrically connected with the thin film transistor through the conductive trace. The functional chip is disposed on the first surface of the substrate, and the functional chip is electrically connected with the thin film transistor through the fourth connection pad.

In some embodiments, the electronic device further comprises a protection layer covering the thin film circuit and the functional chip.

In some embodiments, a plurality of the substrates are disposed on the driving circuit board in an array, each of the substrates comprises a plurality of the thin film circuits and a plurality of the first connection pads, each of the thin film circuits is electrically connected with corresponding ones of the first connection pads, the driving circuit board comprises a plurality of the second connection pads, a plurality of the conductive members are formed, one of the first connection pads corresponding to one of the thin film circuits and one of the second connection pads of the driving circuit board are electrically connected through one of the conductive members, and two of the thin film circuits disposed on adjacent two of the substrates are electrically connected through the connection among two of the first connection pads, at least one of the second connection pads corresponding to the two first connection pads, and two of the conductive members respectively corresponding to the two first connection pads.

In some embodiments, a plurality of the substrates are disposed on the driving circuit board in an array, each of the substrates comprises a plurality of the thin film circuits and a plurality of the first connection pads, each of the thin film circuits is electrically connected with corresponding ones of the first connection pads, the driving circuit board comprises a plurality of the second connection pads, a plurality of the conductive members are formed, one of the first connection pads corresponding to one of the thin film circuits and one of the second connection pads of the driving circuit board are electrically connected through one of the conductive members, and two of the thin film circuits disposed on adjacent two of the substrates are electrically connected through the connection among two of the first connection pads, at least one of the second connection pads corresponding to the two first connection pads, and one of the conductive members corresponding the two first connection pads.

As mentioned above, in the electronic device and manufacturing method thereof according to this disclosure, at least one first connection pad and a thin film circuit comprising at least one thin film transistor and at least one conductive trace are formed on a substrate, and a conductive member is formed to cover at least a part of the second connection pad of the driving circuit board and the first connection pad on the substrate, so that the second connection pad is electrically connected with the first connection pad through the conductive member. According to this design, it is not needed to design different manufacturing processes for products with different sizes and functions, so that the manufacturing process of this disclosure is simpler and has lower cost. Moreover, this disclosure has flexibility in applications so as to be suitable for various product requirements.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

Figure 1:
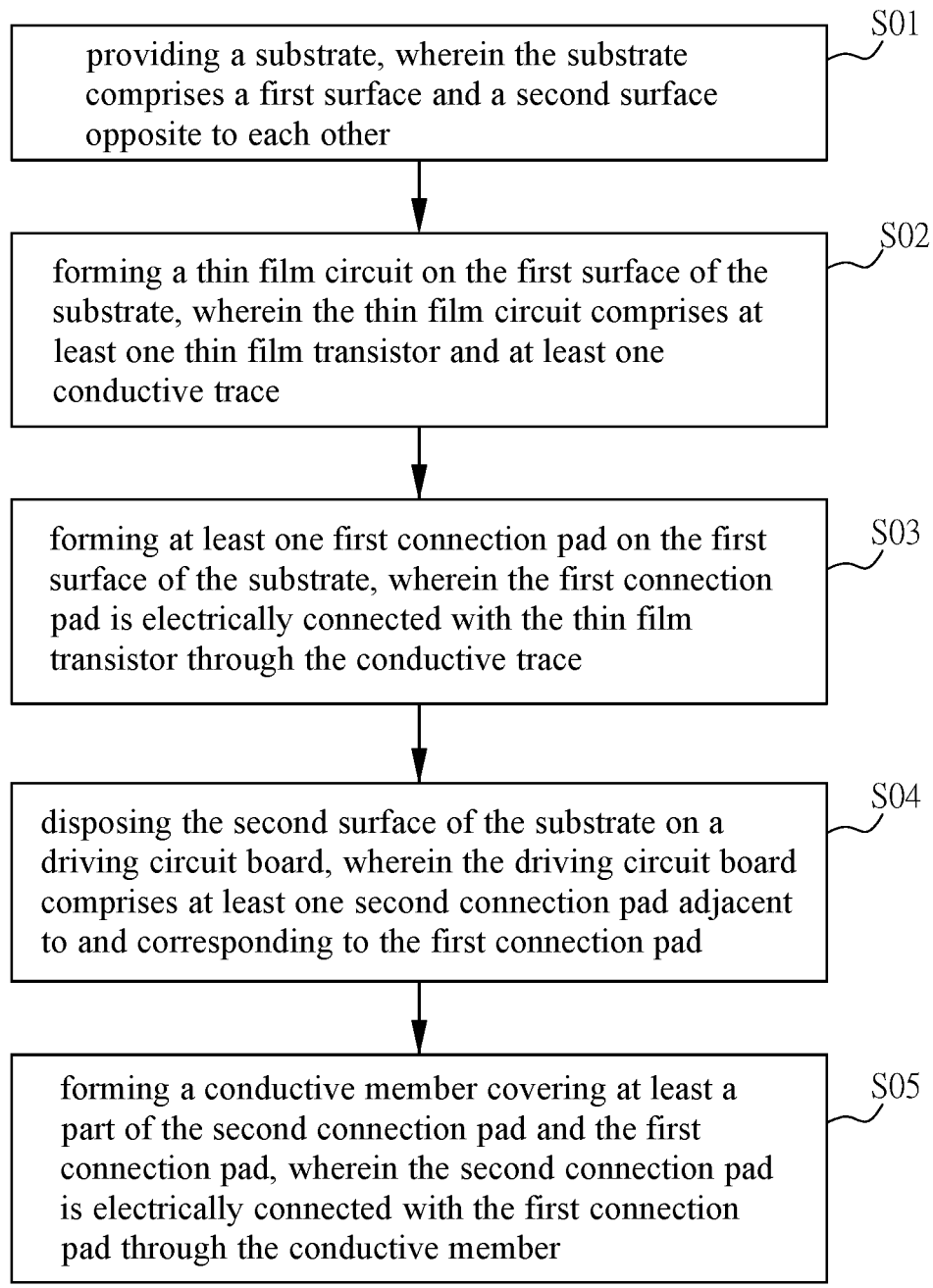
FIG. 1 is a flow chart showing a manufacturing method of an electronic device according to an embodiment of this disclosure.

FIG. 1 is a flow chart showing a manufacturing method of an electronic device according to an embodiment of this disclosure. As shown in FIG. 1, the manufacturing method of an electronic device comprises: providing a substrate, wherein the substrate comprises a first surface and a second surface opposite to each other (step S01); forming a thin film circuit on the first surface of the substrate, wherein the thin film circuit comprises at least one thin film transistor and at least one conductive trace (step S02); forming at least one first connection pad on the first surface of the substrate, wherein the first connection pad is electrically connected with the thin film transistor through the conductive trace (step S03); disposing the second surface of the substrate on a driving circuit board, wherein the driving circuit board comprises at least one second connection pad adjacent to and corresponding to the first connection pad (step S04); and forming a conductive member covering at least a part of the second connection pad and the first connection pad, wherein the second connection pad is electrically connected with the first connection pad through the conductive member (step S05).

In some embodiments, the substrate could be an insulation substrate or a conductive substrate with an additional insulation layer attached thereto. In some embodiments, the substrate could be a rigid board or a flexible board. If the substrate is a flexible board, the flexible board is formed on a rigid carrier in advance so as to easily perform the following processes to form other components on the flexible board and to make the operation of the flexible board easier. Afterwards, the rigid carrier could be removed after accomplishing relevant processes. If the insulation substrate is a rigid board, the rigid carrier as well as the additional processes is not needed.

The detailed descriptions of the above steps will be disclosed hereinafter with reference to FIG. 1 in view of FIGS. 2A to 2K. FIGS. 2A, 2C, 2D, 2H, 2I and 2J are schematic diagrams showing the layouts of the electronic device during the manufacturing process according to an embodiment of this disclosure. FIG. 2B is a sectional view of the substrate according to an embodiment of this disclosure. FIGS. 2E to 2G are sectional views of FIG. 2D along the line 2E-2E, the line 2F-2F and the line 2G-2G FIG. 2H is a schematic diagram showing the layout of the driving circuit board according to an embodiment of this disclosure. FIG. 2I is a schematic diagram showing the layout of the surface mounted element according to an embodiment of this disclosure. FIG. 2K is a schematic diagram showing the circuit of the embodiment of FIG. 2J.

Figure 2A:
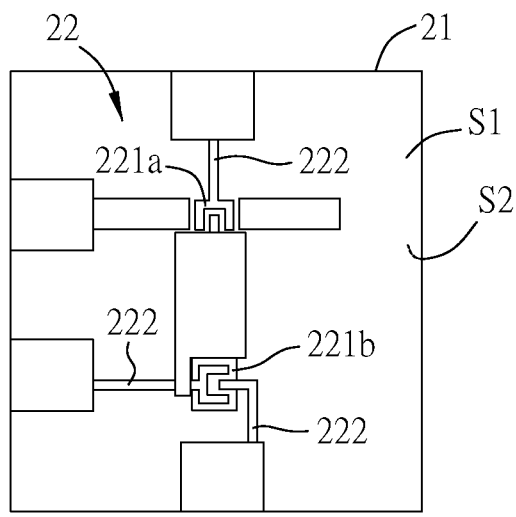
FIGS. 2A, 2C and 2D are schematic diagrams showing the layouts of the electronic device during the manufacturing process according to an embodiment of this disclosure.
Figure 2B:
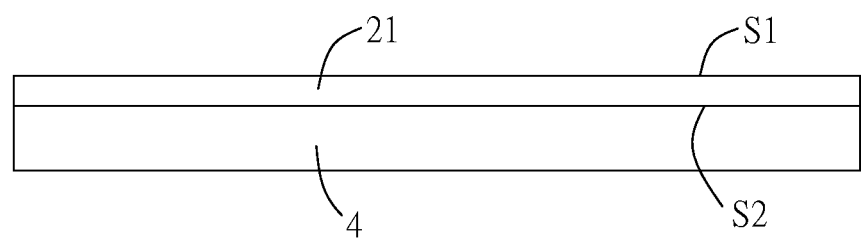
FIG. 2B is a sectional view of the substrate according to an embodiment of this disclosure.

As shown in FIG. 2A, the step S01 is to provide a substrate 21, wherein the substrate 21 defines a first surface S1 and a second surface S2 opposite to each other. In this embodiment, the first surface S1 is designated as the upper surface of the substrate 21, while the second surface S2 is designated as the lower surface of the substrate 21. The material of the substrate 21 comprises glass, resin, metal, ceramics, or composite materials. Herein, the resin material is a flexible material, and may comprise organic polymer material, in which the glass transition temperature (Tg) of the organic polymer material is, for example, between 250° C. and 600° C., and preferably between 300° C. and 500° C. Since the resin material with the organic polymer material has a relative higher glass transition temperature, the following thin-film processes could be performed directly on the substrate 21, which is made of the resin material, to form the thin-film transistors and other components or wires. The organic polymer material could be a thermoplastic material, such as polyimide (PI), polyethylene (PE), polyvinylchloride (PVC), polystyrene (PS), acrylic, fluoropolymer, polyester, nylon, and the like.

In some embodiments, as shown in FIG. 2B, the flexible material (e.g. PI) could be formed on a rigid carrier 4 by coating (or adhesion), and then cured (by thermal curing or light curing) to form the substrate 21 (flexible board). Before the step S04 of disposing the substrate 21 (flexible board) on the driving circuit board, the rigid carrier 4 is removed. The rigid carrier 4 could be, for example but not limited to, a glass plate, a ceramic plate, a metal plate, or a quartz plate.

As shown in FIG. 2A again, the step S02 is to form a thin film circuit 22 on the first surface S1 of the substrate 21, wherein the thin film circuit 22 comprises at least one thin film transistor and at least one conductive trace 222. In this embodiment, the step S02 is to form two thin film transistors 221a, 221b and a plurality of conductive traces 222 on the substrate 21, and the thin film transistors 221a, 221b are electrically connected with each other through the conductive traces 222. For example, the thin film circuit 22 and the conductive traces 222 is formed on the substrate 21 by thin film process. The thin film transistors 221a, 221b and the conductive traces 222 could be directly formed on the substrate 21. Alternatively, the thin film transistors 221a, 221b and the conductive traces 222 could be indirectly formed on the substrate 21 by forming, for example but not limited thereto, a buffer layer or an insulation layer therebetween. The above-mentioned thin film process could be a semiconductor manufacturing process, which comprises a low-temperature polycrystalline silicon (LTPS) process, an amorphous silicon (α-Si) process, or a metal oxide semiconductor process (e.g. IGZO), and this disclosure is not limited. The material of the conductive traces 222 could be a single-layer structure or a multi-layer structure made of metal (e.g. Al, Cu, Ag, Mo or Ti) or alloys thereof. A part of the thin film transistors 221a, 221b (e.g. a source or a drain) can be made by the same material and manufacturing process as the conductive traces 222, thereby reducing the manufacturing cost. In some embodiments, the conductive traces 222 could be directly electrically connected with the thin film transistors 221a, 221b, or indirectly electrically connected with the thin film transistors 221a, 221b via other conductive layers. In some embodiments, the conductive traces 222 could be the wires for electrically connecting the thin film transistors 221a and 221b. In some embodiments, the conductive traces 222 could be the wires for electrically connecting the thin film transistors 221a, 221b with other components. In some embodiments, an insulation layer could be provided to separate two conductive traces 222 from each other for preventing the short circuit therebetween. This disclosure is not limited. The above-mentioned conductive traces 222 are served as a collective term, and any conductive film, layer or wire of the thin film circuit 22 formed on the substrate 21 could be referred to the conductive trace 222. In some embodiments, the conductive traces 222 may further include the wire for transmitting scan signals (scan line) or the wire for transmitting data signals (data line), the coverage or the definition of the conductive traces 222 is determined based on the function and use of the electronic device.

Figure 2C:
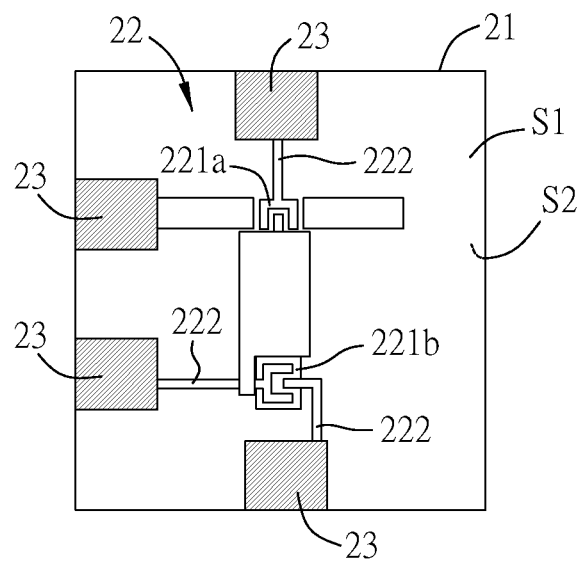

Next, as shown in FIG. 2C, the step S03 is performed to form at least one first connection pad 23 on the first surface S1 of the substrate 21, wherein the first connection pad 23 is electrically connected with the thin film transistors 221a, 221b through the conductive trace 222. In this embodiment, four first connection pads 23 are formed on the first surface S1 of the substrate 21, and the four first connection pads 23 are located at the edge of the substrate 21 and respectively overlap the conductive traces 222. Accordingly, the first connection pads 23 electrically connect with the thin film transistors 221a, 221b through the conductive traces 222. The material of the first connection pads 23 is, for example but not limited to, Cu, Ag, Au, or their combinations, or any of other suitable conductive materials. In some embodiments, in order to manufacture a thicker first connection pad 23, the first connection pad 23 could be formed on the conductive trace 222 by, for example, plating, printing, or evaporation and lift-off patterning. In some other embodiments, the first connection pad 23 could be formed by the thin film process, and this disclosure is not limited thereto. Besides, the manufacturing of the first connection pads 23 (step S03) and the manufacturing of the thin film circuit 22 (step S02) could be swapped. In other words, the first connection pads 23 could be formed after or before the manufacturing of the thin film transistors 221a, 221b and the conductive traces 222.

Figure 2D:
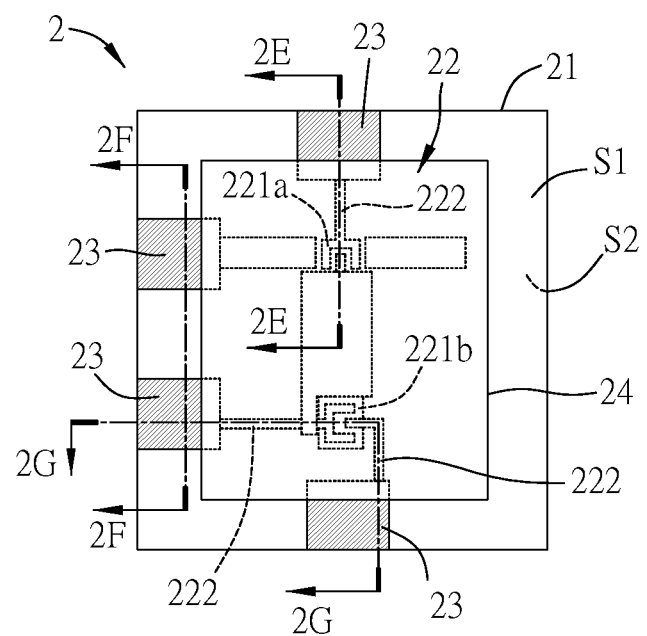
Figure 2E:
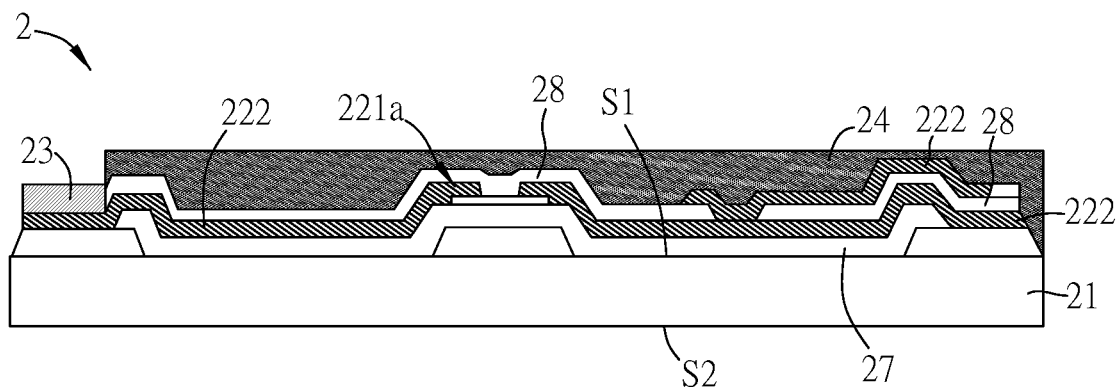
FIGS. 2E to 2G are sectional views of FIG. 2D along the line 2E-2E, the line 2F-2F and the line 2G-2G.
Figure 2F:
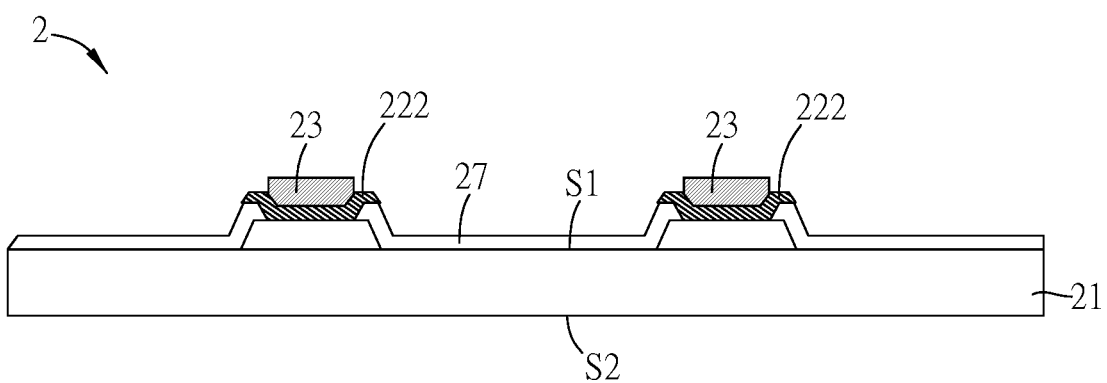
Figure 2G:
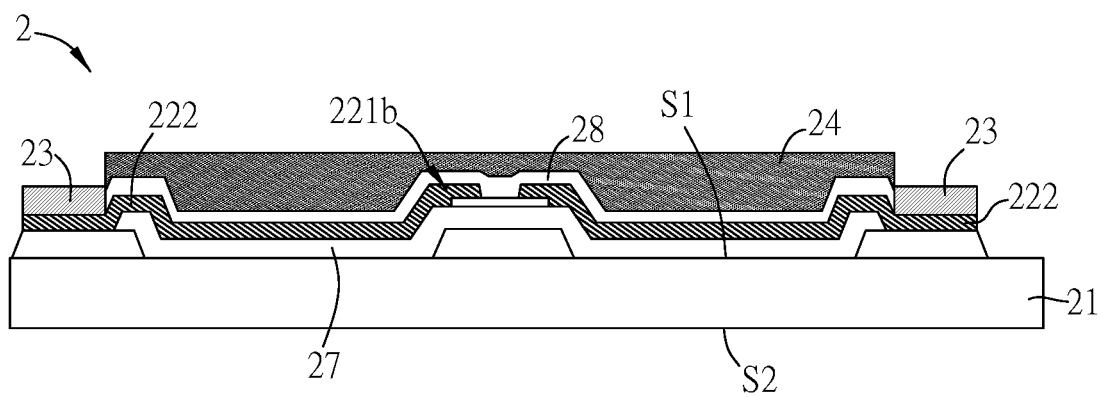
Figure 2H:
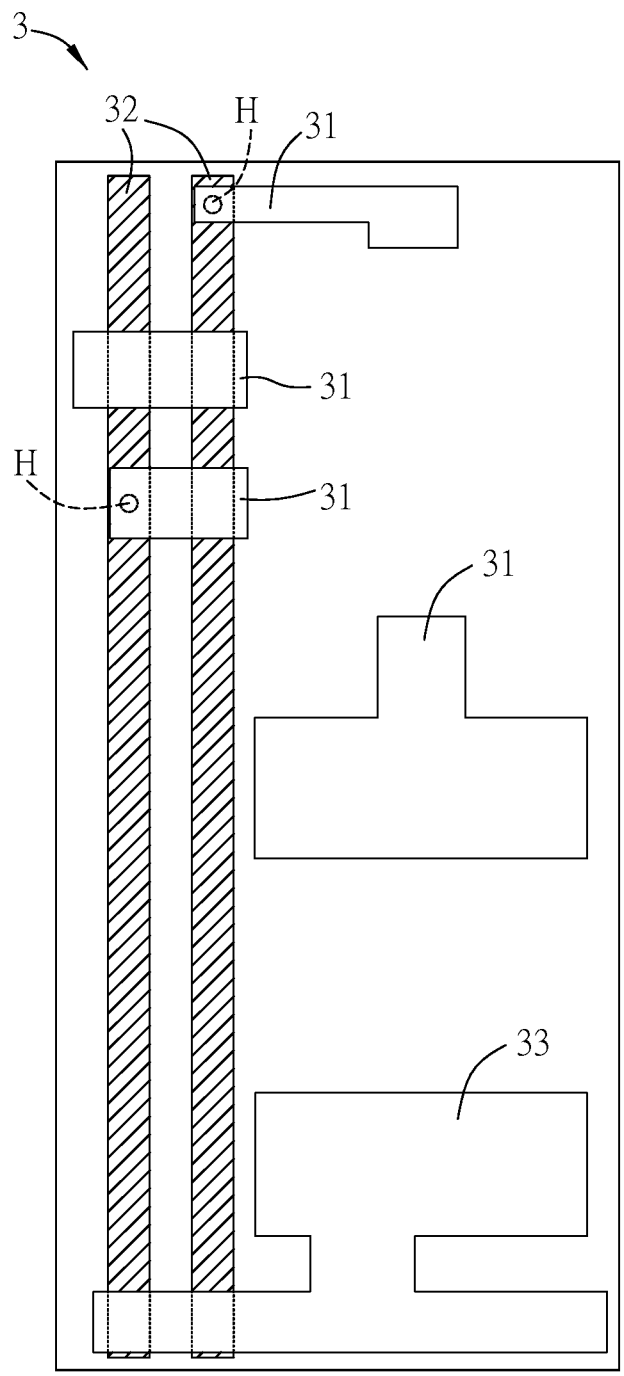
FIG. 2H is a schematic diagram showing the layout of the driving circuit board according to an embodiment of this disclosure.
Figure 2I:
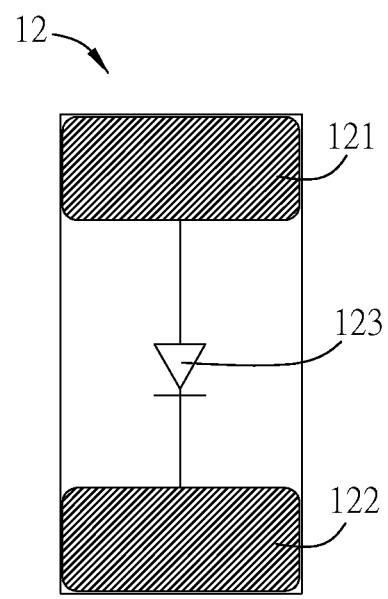
FIG. 2I is a schematic diagram showing the layout of the surface mounted element according to an embodiment of this disclosure.

Referring to FIG. 2D, after the step S02 of forming the thin film circuit 22 on the substrate 21, the manufacturing method further comprises: forming a protection layer 24 to cover the thin film circuit 22 so as to complete a thin film circuit substrate 2. In this embodiment, the protection layer 24 is formed to cover the thin film circuit 22 by resin transfer molding, sealant dispensing or other suitable means to prevent moisture or dusts from entering the thin film circuit 22 that could destroy the performance thereof. In some embodiments, the protection layer 24 could be formed at the same time, while the thin film circuit 22 is manufactured, for example, in an LTPS process, thereby reducing the manufacturing cost. In some embodiments, the protection layer 24 may also be formed after the step S03 of forming the first connection pads 23, and this disclosure is not limited thereto.

In this embodiment, the protection layer 24 covers a part of each of the first connection pads 23, and the other part of each of the first connection pads 23, which is not covered by the protection layer 24, could be used to electrically connect with the corresponding second connection pad through the conductive member. To be noted, the protection 24 could alternatively overlap each of the first connection pads 23 or not. In some embodiments, when the protection layer 24 is arranged to further extend or to be only disposed around each of the first connection pads 23, it could prevent the short circuit between the any adjacent two of the first connection pads 23 (for transmitting different signals) caused by the diffusion of the conductive member. Moreover, in this embodiment, as shown in FIGS. 2E to 2Q in addition to the thin film transistors 221a, 221b, the conductive traces 222, the first connection pads 23 and the protection layer 24 on the substrate 21, the thin film circuit 22 is capable of providing other layers such as the insulation layers 27, 28, and/or other buffer layers.

Afterwards, as shown in FIGS. 2D and 2H, the step S04 is performed to dispose the second surface S2 of the substrate 21 on a driving circuit board 3, wherein the driving circuit board 3 comprises at least one second connection pad 31 adjacent to and corresponding to the first connection pad 23 of the first surface S1 of the substrate 21. The driving circuit board 3 could be a flexible circuit board or a rigid circuit board, and this disclosure is not limited thereto. In this embodiment, the second surface S2 of the substrate 21 is designated as the lower surface of the thin film circuit substrate 2 as shown in FIG. 2D, and the second surface S2 faces and contacts the driving circuit board 3 (see FIG. 2H) by, for example but not limited to, adhesion or other suitable means. As shown in FIG. 2H, the driving circuit board 3 of this embodiment comprises four second connection pads 31, and the material and manufacturing process of the second connection pad 31 could be the same as those of the first connection pad 23. Of course, the material and manufacturing process of the second connection pad 31 could be different from those of the first connection pad 23. The layout for manufacturing the second connection pads 31 must refer to the layouts of the thin film circuit 22 and the first connection pads 23 of the thin film circuit substrate 2, the second connection pads 31 comprehensively could be adjacent to and corresponding to the first connection pads 23, respectively (see FIG. 2J), while the thin film circuit substrate 2 is disposed on the driving circuit board 3.

Referring to FIG. 2H, the driving circuit board 3 further comprises two conductive traces 32, and three of the second connection pads 31 are disposed to partially cover the two conductive traces 32. Herein, only two of the second connection pads 31 are electrically connected with the corresponding conductive traces 32 through a conductive hole H. The conductive material, which is for example but not limited to copper paste, is provided to fill the conductive hole H. As shown in FIG. 2H, there is one second connection pad 31, which is disposed to partially cover one of the conductive traces 32 but does not electrically connect to any one of the conductive traces 32 due to no conductive hole H thereof. In other words, an insulation layer could be provided to separate the second connection pad 31, which is without the conductive hole H, from the corresponding one of the underneath conductive traces 32, so that this second connection pad 31 does not electrically connect with the underneath two conductive traces 32. In addition, the driving circuit board 3 of this embodiment further comprises at least one third connection pad 33, which is disposed to partially cover the conductive traces 32, and the third connection pad 33 does not electrically connect to the conductive traces 32, either.

Figure 2J:
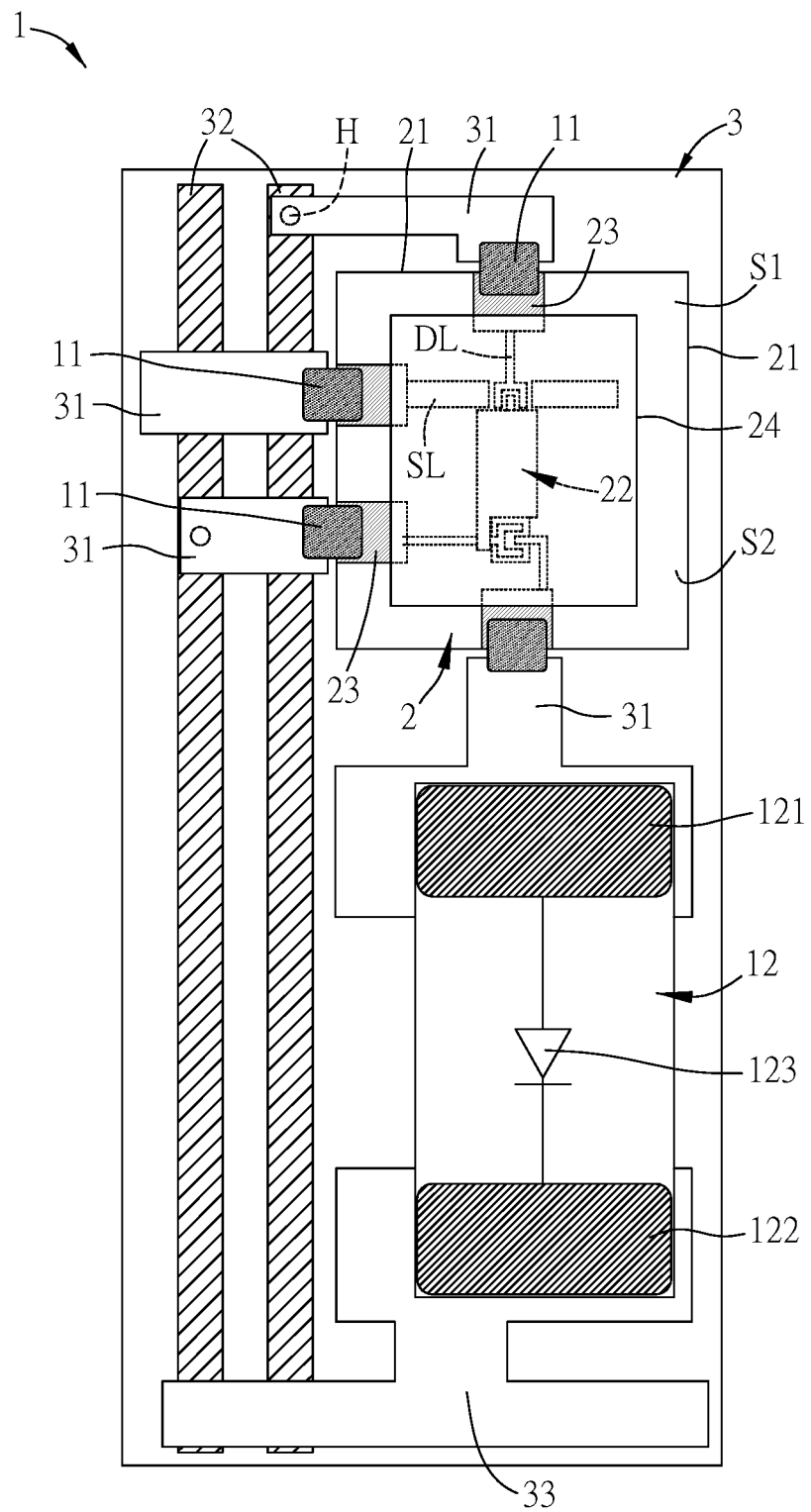
FIG. 2J is a schematic diagram showing the layout of the electronic device according to an embodiment of this disclosure.
Figure 2K:
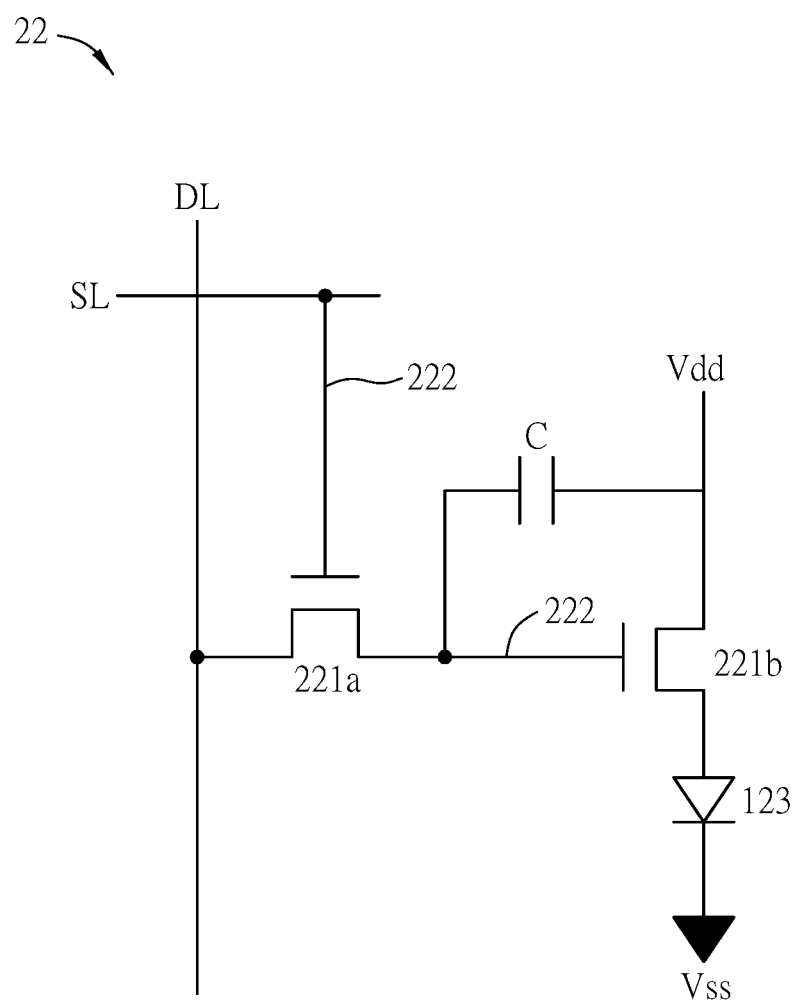
FIG. 2K is a schematic diagram showing the circuit of the embodiment of FIG. 2J.

Next, the step S05 is performed to form a conductive member 11 to cover at least a part of one of the second connection pad 31 and an adjacent one of the first connection pads 23, wherein the second connection pad 31 is electrically connected with the corresponding first connection pad 23 through the conductive member 11. To be elaborated, the wording "to cover at least a part of the second connection pad 31 and the first connection pad 23" could be narrated as "to cover at least a part of the second connection pad 31 and to cover at least a part of the first connection pad 23". As shown in FIG. 2J, the conductive member 11 could be formed by jet printing or coating to cover at least a part of the second connection pad 31 and the first connection pad 23, thereby electrically connecting the two components. The material of the conductive member 11 can be, for example but not limited to, solder paste, silver paste, anisotropic conductive paste, their combinations, or any of other suitable materials. This disclosure is not limited. In this embodiment, four conductive members 11 are served to partially cover the second connection pads 31 and the first connection pads 23 respectively, so that the second connection pads 31 can be electrically connected with the corresponding first connection pads 23 through the four conductive members 11 in a one-on-one manner.

Moreover, as shown in FIGS. 2I and 2J, the manufacturing method of the electronic device 1 according to this embodiment further comprises: disposing a surface mounted element 12 on the driving circuit board 3. In this embodiment, the surface mounted element 12 is arranged on the driving circuit board 3 by surface mounted technology (SMT). The surface mounted element 12 could be a package component and be, for example, a bipolar component having two connection pads. such as, for example but not limited to, a package component comprising at least one light-emitting diode (LED) chip or micro LED (μLED) chip. In some embodiments, the solder is heated and melted for electrically connecting the two connection pads of the surface mounted element 12 and the corresponding pads of the second connection pads 31 and the third connection pad 33 of the driving circuit board 3.

FIG. 2K is a schematic diagram showing the circuit of the electronic device 1 of FIG. 2J. FIG. 2K shows a 2T1C circuit structure. To be noted, in other embodiments, the electronic device could have any circuit structure, such as 4T2C or 5T1C, and this disclosure is not limited thereto.

As shown in FIG. 2K, in addition two thin film transistors 221a, 221b and a plurality of conductive traces 222, the thin film circuit 22 further comprises a capacitor C. The connection relationship of the components of the thin film circuit 22 could be referred to FIG. 2K, and the related description thereof will be omitted. In this embodiment, the plurality of conductive traces 222 comprise scan lines SL, data lines DL, the wires for connecting the thin film transistors 221a, 221b, and the wires for respectively connecting the thin film transistors 221a, 221b and the first connection pads 23. Accordingly, when the scan line SL transmits the scan signal to conduct the thin film transistor 221a, the data line DL can transmit the data signal through the thin film transistor 221a and reach the gate of the thin film transistor 221b. Then, the thin film transistor 221b could be conducted, so that the voltage Vdd can be sent to a light-emitting diode chip 123 of the surface mounted element 12 through the thin film transistor 221b, thereby controlling the light-emitting diode chip 123, which is encapsulated onto the surface mounted element 12, to emit light.

As mentioned above with reference to FIGS. 2J and 2K, the electronic device 1 according to this embodiment comprises a substrate 21, a thin film circuit 22, a plurality of first connection pads 23, a driving circuit board 3, and a plurality of conductive members 11. The substrate 21 comprises a first surface S1 and a second surface S2 opposite to each other. The thin film circuit 22 is disposed on the first surface S1 of the substrate 21, and the thin film circuit 22 comprises the thin film transistors 221a, 221b and conductive traces 222. To be noted, FIG. 2J does not illustrate the reference numbers 221a, 221b and 222 for the sake of simplification and clean. The first connection pads 23 are disposed on the first surface S1 of the substrate 21, and the first connection pads 23 are electrically connected with the thin film transistors 221a, 221b through the conductive traces 222. The driving circuit board 3 comprises a plurality of second connection pads 31. The second surface S2 of the substrate 21 is disposed on a driving circuit board 3, and the second connection pads 31 of the driving circuit board 3 are adjacent to and corresponding to the first connection pads 23 on the substrate 21, respectively. In addition, the conductive members 11 cover at least a part of the second connection pads 31 and the first connection pads 23, and each of the second connection pads 31 are electrically connected with the corresponding first connection pads 23 through the corresponding conductive members 11.

In addition, the electronic device 1 further comprises a surface mounted element 12, which may be a package component comprising a light-emitting diode chip 123 and two connection pads 121, 122. In this case, the surface mounted element 12 is electrically connected with the thin film transistor 221b through one the connection pad 121 thereof and a corresponding one of the second connection pads 31, and is electrically connected with the driving circuit board 3 through the other one connection pad 122 and the third connection pad 33. The third connection pad 33 is electrically connected to the power source of voltage Vss (e.g. ground, 0V). Accordingly, the driving circuit of the driving circuit board 3 could transmit the corresponding scan signals and data signals respectively through the conductive traces 32, the second connection pads 31, the conductive members 11, the first connection pads 23, and the thin film transistors 221a, 221b and conductive traces 222 of the thin film circuit 22, so as to electrically connect to power sources as Vdd or Vss through the conductive traces 32, the second connection pads 31, the conductive members 11, the first connection pads 23, and the third connection pad 33, thereby driving the light-emitting diode chip 123 of the surface mounted element 12 to emit light. In some embodiments, the light-emitting diode chip 123 could emit, for example, red light, blue light, green light, UV light, IR light, or the light of any of other wavelengths.

Figure 3A:
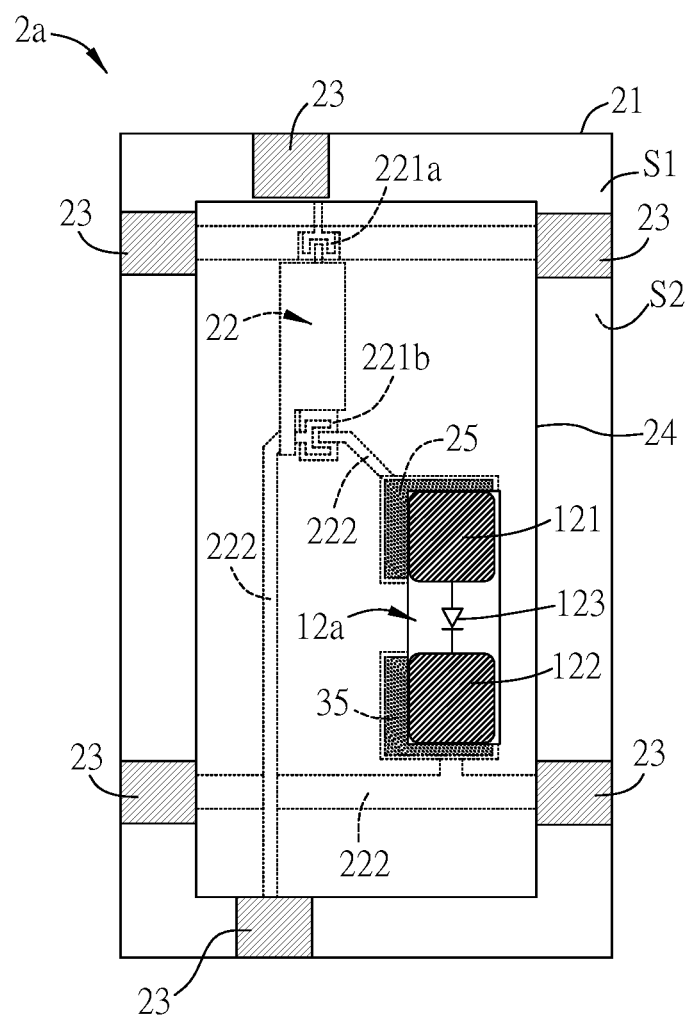
FIGS. 3A and 3B are schematic diagrams showing the layouts of the thin film circuit substrates in different embodiments of this disclosure.
Figure 3B:
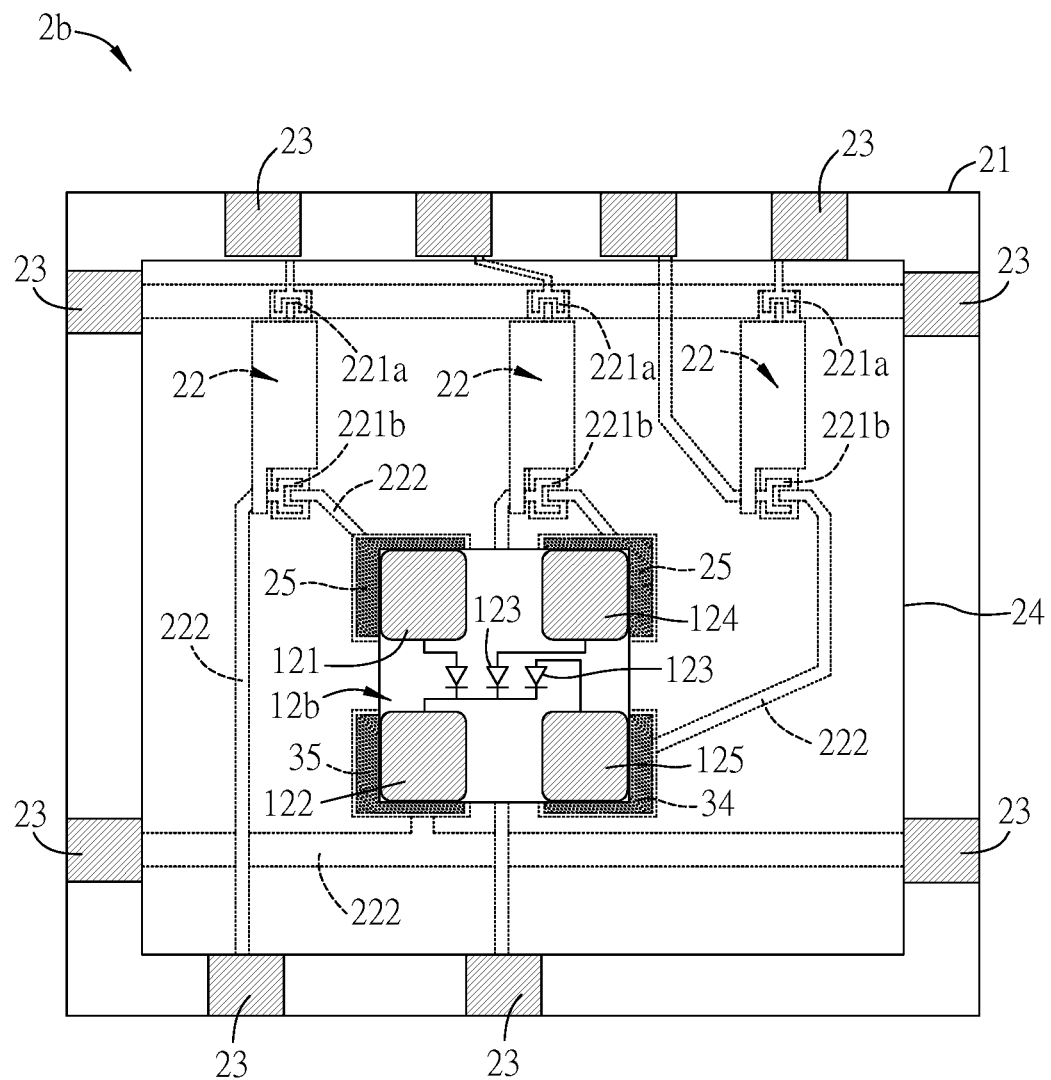

FIGS. 3A and 3B are schematic diagrams showing the layouts of the thin film circuit substrates 2a, 2b in different embodiments of this disclosure.

Referring to FIG. 3A, the manufacturing procedure and components provided on the thin film circuit substrate 2a and the connections of the components in this embodiment are mostly the same as those of the thin film circuit substrate 2 of the previous embodiment. Different from the previous embodiment, the manufacturing method of the thin film circuit substrate 2a further comprises: forming at least one fourth connection pad 25 on the first surface S1 of the substrate 21, wherein the fourth connection pad 25 is electrically connected with the thin film transistor 221b through a corresponding one of the conductive traces 222; and disposing a surface mounted element 12a on the first surface S1 of the substrate 21, wherein the surface mounted element 12a is electrically connected with the thin film transistor 221b through the fourth connection pad 25 and the corresponding one of the conductive traces 222. Accordingly, the thin film circuit 22 could drive the light-emitting diode chip 123 of the surface mounted element 12a to emit light. For example, a sixth connection pad 35, which is connected with the cathode of the light-emitting diode chip 123, can be electrically connected to the ground through a corresponding one of the conductive traces 222. To be noted, since the surface mounted element 12a needs to electrically connected with the fourth connection pad 25 and the sixth connection pad 35 on the first surface S1 of the substrate 21, the part of the first surface S1 of the substrate 21 for disposing the surface mounted element 12a is not covered by the protection layer 24. In other embodiments, after disposing the surface mounted element 12a, the protection layer 24 is then formed to cover the thin film circuit 22 and the surface mounted element 12a for protecting the thin film circuit 22 and the surface mounted element 12a. This disclosure is not limited thereto.

Referring to FIG. 3B, the manufacturing procedure and components of the thin film circuit substrate 2b and the connections of the components in this embodiment are mostly the same as those of the thin film circuit substrate 2a of the previous embodiment. To be noted, the thin film circuit substrate 2a of the previous embodiment comprises one thin film circuit 22 only, but the thin film circuit substrate 2b of this embodiment comprises three thin film circuits 22, which are arranged in a row and electrically connected with each other. In the layout for arranging three thin film circuits 22, ten first connection pads 23 are provided in this embodiment. Of course, the conductive traces, second connection pads and conductive members of the driving circuit board (not shown) must be designed corresponding to the layout of the thin film circuit substrate 2b. In addition, the surface mounted element 12b is a package component comprising three light-emitting diode chips 123 and four connection pads 121, 122, 124, 125. The connection pad 121 is disposed on the fourth connection pad 25, and is electrically connected with the thin film transistor 221b of the first thin film circuit 22 through the fourth connection pad 25. The connection pad 122 is disposed on the sixth connection pad 35, and is electrically connected with the sixth connection pad 25. For example, the sixth connection pad 35 can be electrically connected to ground through one of the conductive traces 222 and corresponding ones of the first connection pads 23. The connection pad 124 is disposed on another fourth connection pad 25, and is electrically connected with the thin film transistor 221b of the second thin film circuit 22 through the fourth connection pad 25. The connection pad 125 is disposed on the fifth connection pad 34, and is electrically connected with the thin film transistor 221b of the third thin film circuit 22 through the fifth connection pad 34 and one of the conductive traces 222.

In some embodiments, the surface mounted element 12b comprises three sub-pixels, and each sub-pixel is interpreted by one light-emitting diode chip 123. The three light-emitting diode chips 123 representing the three sub-pixels are the red, blue and green LED chips, respectively. Of course, in different embodiments, quantity of the thin film circuits 22 on the thin film circuit substrate could be less than or greater than three, and a corresponding surface mounted element and a corresponding driving circuit board are provided to match with the quantities of the thin film circuits 22. This disclosure is not limited thereto.

Figure 4A:
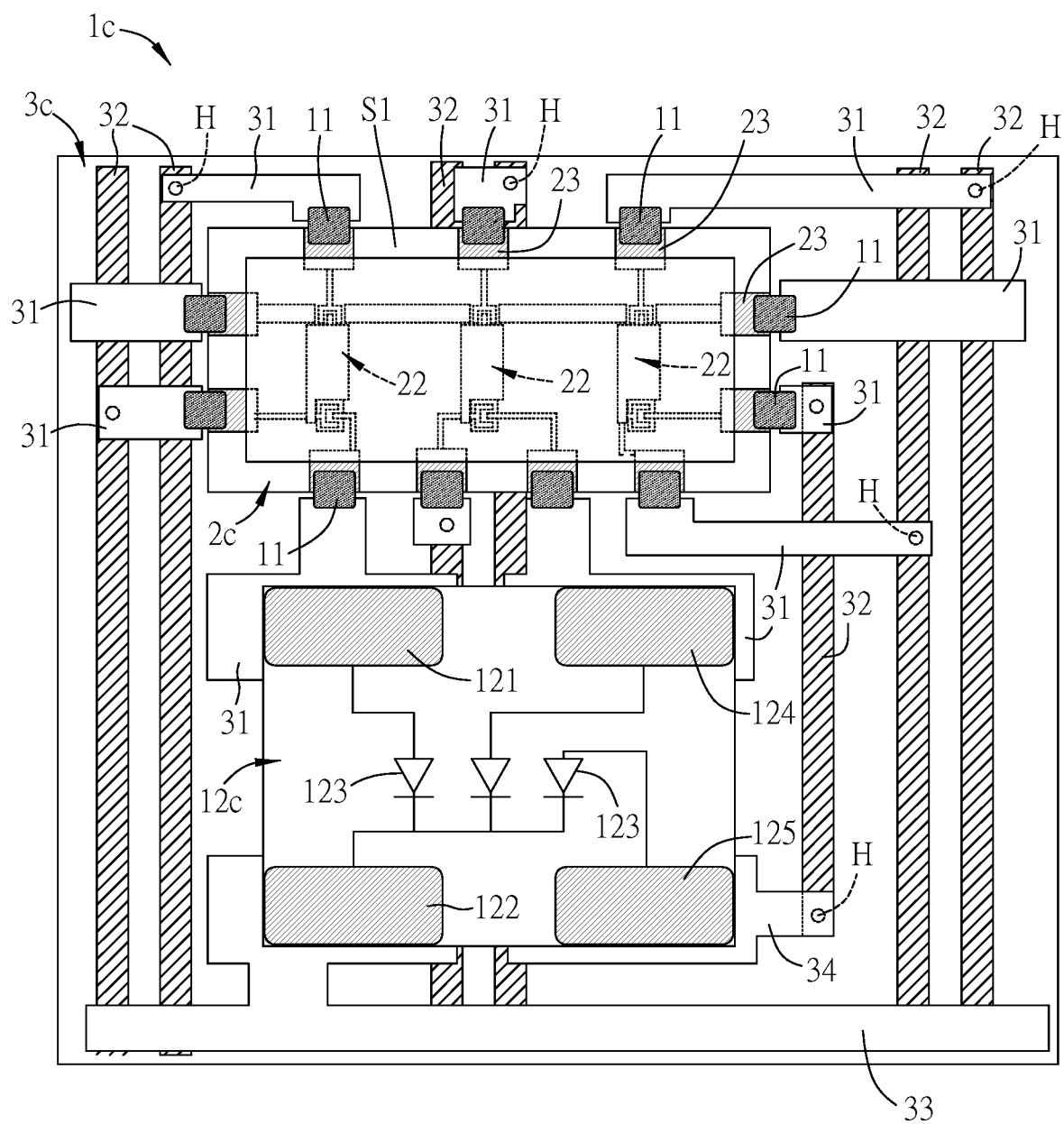
FIGS. 4A to 4C are schematic diagrams showing the layouts of the electronic devices in different embodiments of this disclosure.
Figure 4B:
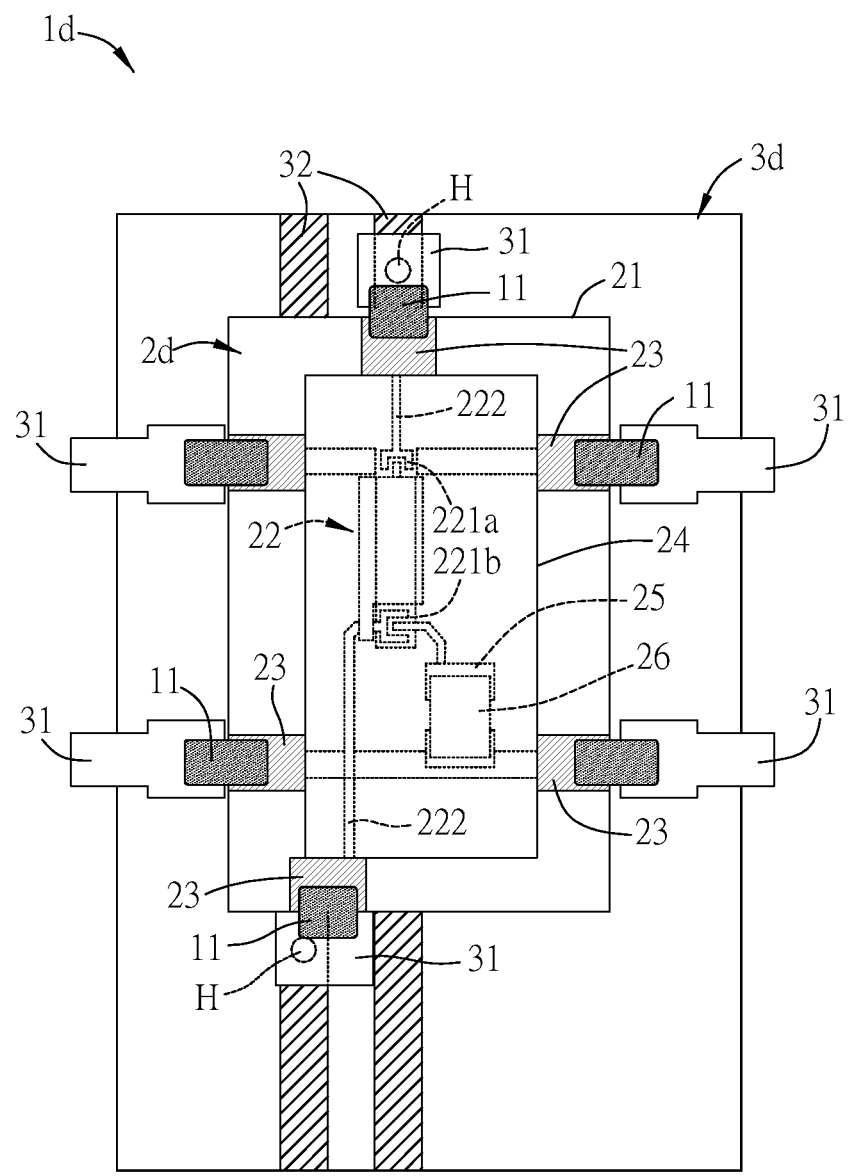
Figure 4C:
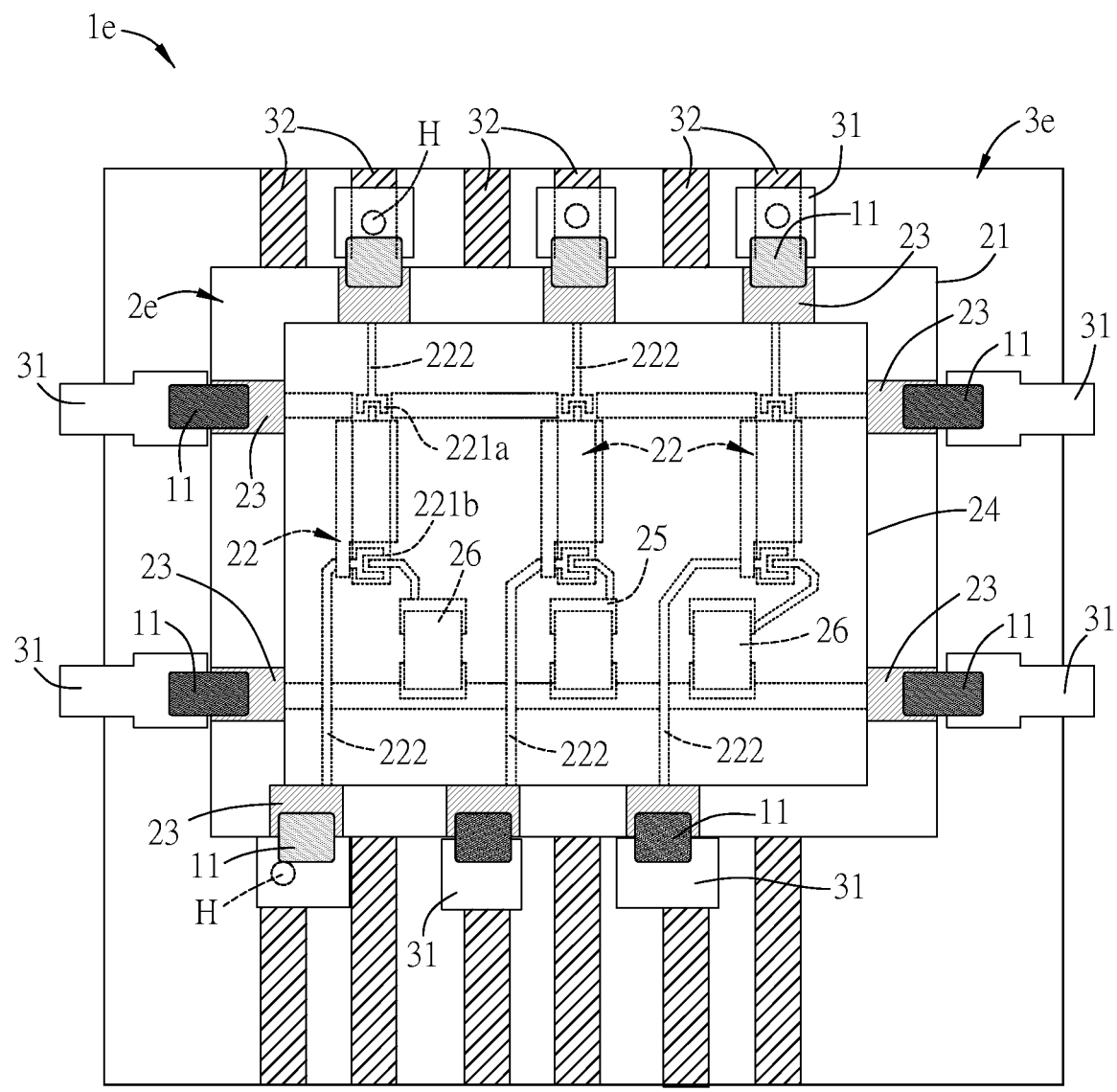

FIGS. 4A to 4C are schematic diagrams showing the layouts of the electronic devices 1c, 1d and 1e in different embodiments of this disclosure.

As shown in FIG. 4A, the manufacturing procedure and components of the electronic device 1c and the connections of the components in this embodiment are mostly the same as those of the electronic device 1 of the previous embodiment. To be noted, the thin film circuit substrate 2 of the electronic device 1 comprises one thin film circuit 22 only, but the thin film circuit substrate 2c of the electronic device 1c of this embodiment comprises three thin film circuits 22, which are arranged in a row and electrically connected with each other. In addition, the conductive traces 32 of the driving circuit board 3c are designed corresponding to the layout of the three thin film circuits 22. In this embodiment, eleven first connection pads 23, eleven second connection pads 31 and eleven conductive members 11 are provided and they are disposed correspondingly. In addition, the surface mounted element 12c is a package component comprising three light-emitting diode chips 123 and four connection pads 121, 122, 124, 125. The connection pad 121 is electrically connected with the thin film transistor 221b of the first thin film circuit 22 through one of the second connection pads 31. The connection pad 122 is electrically connected with the third connection pad 33. For example, the third connection pad 33 can be electrically connected to ground. The connection pad 124 is electrically connected with the thin film transistor 221b of the second thin film circuit 22 through another one of the second connection pads 31. The connection pad 125 is electrically connected with the thin film transistor 221b of the third thin film circuit 22 through the fifth connection pad 34, one of the conductive traces 32 and another one of the second connection pads 31. Accordingly, the driving circuit of the driving circuit board 3c can drive the three light-emitting diode chips 123 of the surface mounted element 12c to emit light individually through the conductive traces 32, the second connection pads 31, the conductive members 11, the first connection pads 23, and the thin film transistors 221a, 221b and conductive traces 222 of the three thin film circuits 22.

In some embodiments, the surface mounted element 12c of the electronic device 1c comprises three sub-pixels, and the three light-emitting diode chips 123 represent the three sub-pixels are the red, blue and green LEDs, respectively, so that the surface mounted element 12, the thin film circuit substrate 2c, and the driving circuit board 3c, on which the surface mounted element 12c and the thin film circuit substrate 2c are disposed, are served together as a full-color pixel unit. The driving circuit board 3c could drive the electronic device 1c to display images. Of course, in different embodiments, quantity of the thin film circuits 22 on the thin film circuit substrate could be less than or greater than three, and this disclosure is not limited thereto.

As shown in FIG. 4B, the manufacturing procedure and components of the electronic device 1d and the connections of the components in this embodiment are mostly the same as those of the electronic device 1 of the previous embodiment. Different from the previous embodiment, the thin film circuit substrate 2d of the electronic device 1d of this embodiment comprises the thin film circuit 22, and the manufacturing method thereof further comprises: disposing at least one functional chip 26 on the first surface S1 of the substrate 21, wherein the functional chip 26 is electrically connected with the thin film transistor 221b through the fourth connection pad 25. Accordingly, the thin film circuit 22 is capable of driving the functional chip 26. In this embodiment, the functional chip 26 could be, for example but not limited to, an LED chip, a micro LED chip, or any other single functional chip. For example, the functional chip 26 could be disposed on the first surface S1 of the substrate 21 by flip-chip step for electrically connecting with the thin film circuit 22. In different embodiments, the functional chip 26 could be disposed on the first surface S1 of the substrate 21 by wire bonding, eutectic bonding (e.g. Au—Sn), ACF (anisotropic conductive film) bonding, ACP (anisotropic conductive paste) bonding, solder ball bonding, or ultrasonic bonding, and this disclosure is not limited thereto. Of course, the conductive traces of the driving circuit board (not shown) is designed corresponding to the layout of the thin film circuit substrate 2d. In addition, after disposing the functional chip 26, the protection layer 24 is formed to cover the thin film circuit 22 and the functional chip 26, thereby protecting the thin film circuit 22 and the functional chip 26 of the thin film circuit substrate 2d from the damage of moisture and dusts.

As shown in FIG. 4C, the manufacturing procedure and components of the electronic device 1e and the connections of the components in this embodiment are mostly the same as those of the electronic device 1d of the previous embodiment. Different from the previous embodiment, the thin film circuit substrate 2e of the electronic device 1e of this embodiment comprises three thin film circuits 22, which are arranged in a row and electrically connected with each other. In addition, the conductive traces 32 of the driving circuit board 3e are designed corresponding to the layout of the three thin film circuits 22. In the layout for arranging three thin film circuits 22, ten first connection pads 23, ten second connection pads 31 and ten conductive members 11 are provided in this embodiment, and they are disposed correspondingly. In addition, corresponding to the amount of the thin film circuits 22, this embodiment comprises three functional chips 26, and each functional chip 26 is electrically connected with the corresponding thin film transistor 221b of the thin film circuit 22 through the fourth connection pad 25, so that the thin film transistor 221b of the thin film circuit 22 drives the corresponding functional chip 26. Accordingly, the driving circuit of the driving circuit board 3e drives the light-emitting diode chip, which is the corresponding functional chip 26 per se, to emit light through the conductive traces 32, the second connection pads 31, the conductive members 11, the first connection pads 23, and the thin film transistors 221a, 221b and conductive traces 222 of the three thin film circuits 22.

In some embodiment, the three functional chips 26 of the electronic device 1e are three LED chips representing three sub-pixels, in which they are the red, blue and green LED chips respectively, so that the driving circuit board 3e, the thin film circuit substrate 2e arranged on the driving circuit board 3e, and the three functional chips 26 arranged on the thin film circuit substrate 2e are served together as a full-color pixel unit. Of course, in different embodiments, quantity of the thin film circuits 22 on the thin film circuit substrate 2e could be less than or greater than three for driving the corresponding functional chips 26, and this disclosure is not limited thereto.

Figure 5:
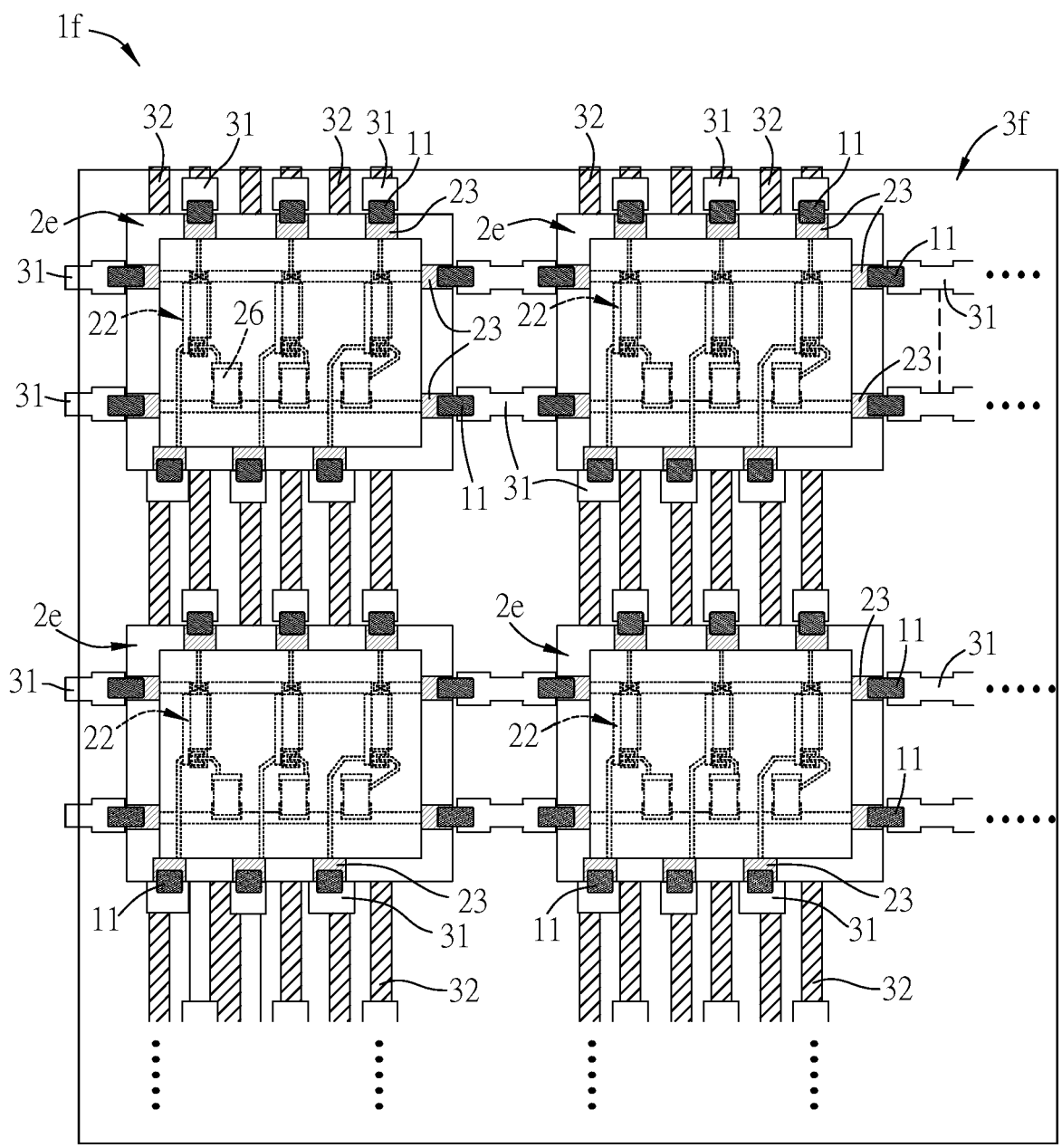
FIG. 5 and FIG. 6 are schematic diagrams showing the layouts of an electronic device according to another embodiments of this disclosure.
Figure 6:
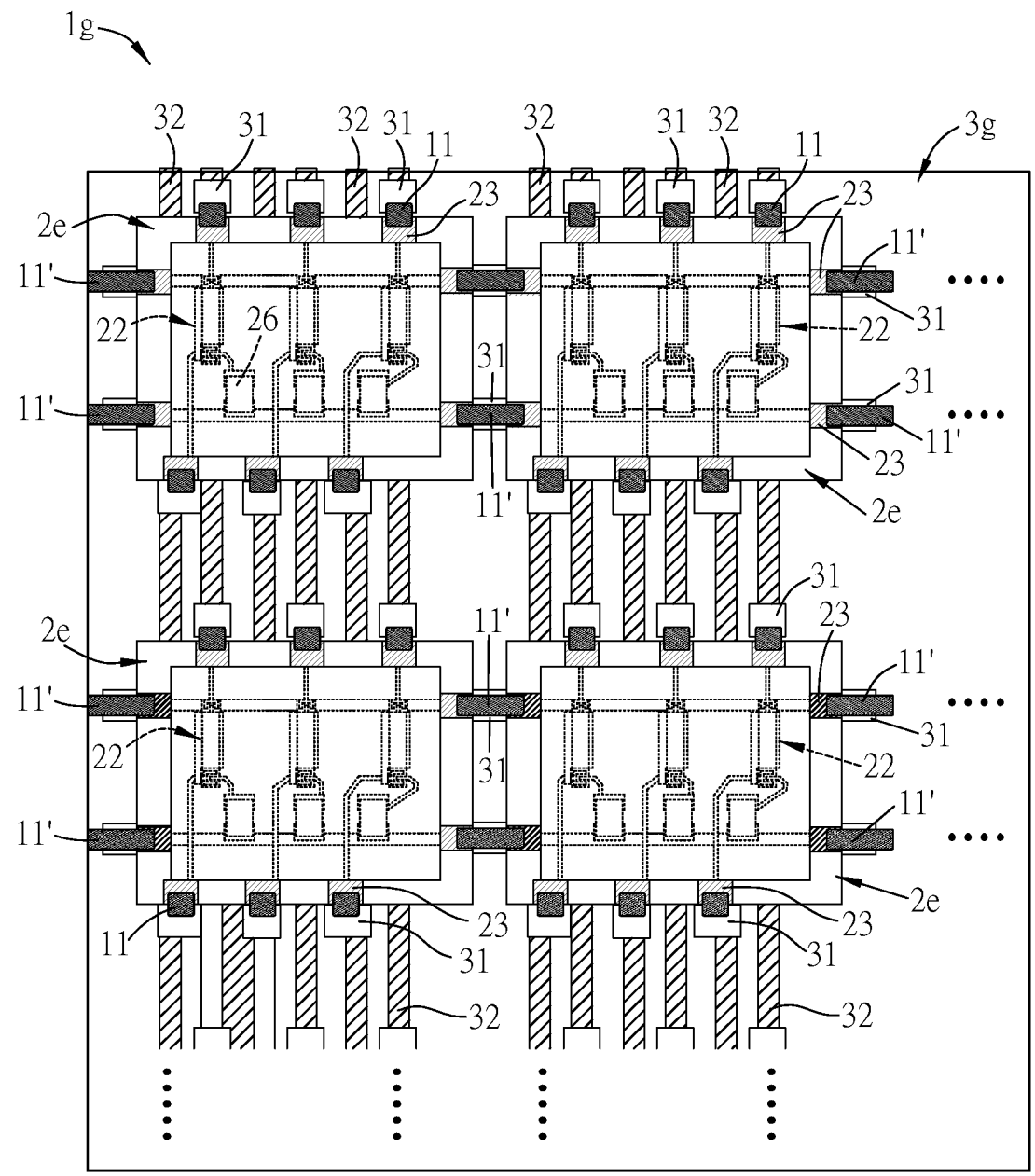

FIGS. 5 and 6 are schematic diagrams showing the layouts of the electronic devices 1f and 1g in different embodiments of this disclosure.

As shown in FIG. 5, the manufacturing procedure and components of the electronic device 1f and the connections of the components in this embodiment are mostly the same as those of the electronic device of the previous embodiment. Different from the previous embodiment, in the electronic device 1f of this embodiment, a plurality of thin film circuit substrates 2e are disposed on a driving circuit board 3f in an array, each of the thin film circuit substrates 2e comprises a substrate 21 formed with a thin film circuit 22 and a first connection pad 23. In the horizontal direction of FIG. 5 (the extension direction of scan line), two adjacent thin film circuits 22, which are respectively arranged on two adjacent substrates 21, are electrically connected with each other through two first connection pads 23, which are respectively arranged on two adjacent substrates 21, one of the second connection pads 31, which is arranged between the two adjacent substrates 21 on the driving circuit board 3f and adjacent to two first connection pads 23 of the two adjacent substrates 21, and two conductive members 11 respectively connecting the two first connection pads 23 with the corresponding one of the second connection pads 31. In the vertical direction of FIG. 5 (the extension direction of data line), two adjacent thin film circuits 22 respectively disposed on two adjacent substrates 21 are electrically connected with each other through two first connection pads 23 respectively disposed on two adjacent substrates 21, the corresponding two of the second connection pads 31 respectively adjacent to the two first connection pads 23, and two conductive members 11 respectively and electrically connecting the two second connection pads 31 and the two first connection pads 23. Specifically, each of the two adjacent substrates 21 comprises a plurality of thin film circuits 22 and a plurality of first connection pads 23, and each thin film circuit 22 is electrically connected with one or more corresponding ones of the first connection pads 23. The driving circuit board 3f comprises a plurality of second connection pads 31. To be elaborated, no matter for one single film circuit substrate 2e or for two adjacent film circuit substrates 2e, the layout relationship between the connection pad(s) 31 and the second connection pad(s) 31 could be defined as "at least one of the second connection pads 31 adjacent to corresponding two of the first connection pads 23". For generic description, the electronic device comprises at least one conductive member for connecting two of the first connection pads with at least one of the second connection pads. In this embodiment, the electronic device 1f comprises two conductive members 11, which are disposed in accordance with the two thin film circuits 22 of the two adjacent substrates 21. In the horizontal direction of FIG. 5 (the extension direction of scan line), one first connection pad 23 of one thin film circuit 22 on one substrate 21 stands face-to-face with a corresponding one first connection pad 23 of a corresponding thin film circuit 22 of another substrate 21, which is adjacent to the previous substrate 21. To be elaborated, the above-mentioned two first connection pads 23 on two adjacent substrates 21 correspond to one single second connection pad 31, and two conductive members 11 respectively climb upon the two adjacent substrates 21 to reach the two first connection pads 23 from the one single second connection pad 31 so as to make an electrical connection between the two first connection pads 23 of the two adjacent substrates 21. For further comprehension, the single second connection pad 31 illustrated in FIG. 5 is revealed as a bone-shaped pad, so that two ends, per se, of the bone-shaped pad could be defined as two second connection pads. In some embodiments, the middle of the bone-shaped pad could be covered by an opaque protection layer or the like, so that two ends, per se, of the bone-shaped pad are visible as two second connection pads. In these case, two thin film circuits 22 disposed on two adjacent substrates 21 could be electrically connected with each other through two first connection pads 23, two second connections pads 31, and two conductive members 11. The shape of the second connection pads is not limited to the above example. For example, the driving circuit board 3f may have the second connection pad with a uniform shape, other than the bone shape. Therefore, in this embodiment and other embodiments of this disclosure, the number and configuration of the second connection pad(s) 31 are not limited. The thin film circuits 22 electrically connected to the functional chips 26 can form a matrix circuit and are electrically connected with the driving circuit board 3f for driving the functional chips 26 in the matrix circuit by the driving circuit board 3f. The plurality of thin film circuit substrates 2e of the present embodiment are configured in a matrix with multiple rows and columns to form an active matrix (AM) electronic device such as, for example but not limited to, an AM LED display device, an AM micro LED display device, or an AM electronic device with another function.

In some embodiments, the plurality of thin film circuit substrates 2e can be separately disposed on the driving circuit board 3f. For example, the thin film circuit substrates 2e could be arranged in a column, a row, a matrix with rows and columns, a polygonal shape, or an irregular shape for meeting the needs of the client. Two adjacent thin film circuits 22 could be electrically connected with each other through the first connection pads 23, the conductive members 11 and the second connection pad(s) 31 (and the conductive traces 32). In other words, the manufacturer can design the drive circuit board 3f depending on the required size and put the thin film circuit substrate 2e with corresponding size onto the drive circuit board 3f for accomplishing the manufacture of the electronic device 1f. Therefore, the manufacturer can fabricate the product in the desired size according to the application requirements, and the application flexibility is quite high.

As shown in FIG. 6, the manufacturing procedure and components of the electronic device 1g and the connections of the components in this embodiment are mostly the same as those of the electronic device 1e of the previous embodiment. Different from the previous embodiment, in the electronic device 1g of this embodiment, in the horizontal direction of FIG. 6 (the extension direction of scan line), two thin film circuits 22 disposed on two adjacent substrates 21 are electrically connected with each other through two first connection pads 23, the corresponding second connection pad(s) 31, and one single conductive member 11'. Accordingly, the driving circuit board 3g drives the functional chips 26 in the matrix circuit. Specifically, one first connection pad 23 of one thin film circuit 22 on one substrate 21 stands by a corresponding one first connection pad 23 of one thin film circuit 22 of another individual substrate 21, which is adjacent to the previous substrate 21. The above-mentioned two first connection pads 23 on two adjacent substrates 21 correspond to one single second connection pad 31, and one single conductive member 11' straddles upon the two adjacent substrates 21 to reach the two first connection pads 23 with two ends thereof from the one single second connection pad 31 so as to make an electrical connection between the two first connection pads 23 on the two adjacent substrates 21. In this embodiment, the electronic device 1g comprises a single conductive member 11' to cover the adjacent two first connection pads 23 and one second connection pad 31 for electrically connecting two adjacent thin film circuits 22. Embodiments of the second connection pad(s) 31, mostly the same as those of the electronic device of the previous embodiment, could be one visible second connection pad 31 or two visible second connection pads 31 but taken as a single one member in practice. Accordingly, this embodiment can reduce the manufacturing process due to the quantity of "one" conductive member 11', and the pitch between two thin film transistor substrates 2e can be decreased. Therefore, the size and cost of the electronic device 1g can be reduced in the case of the same resolution.

To be noted, the design concepts of the electronic device 1f of FIG. 5 and the electronic device 1g of FIG. 6 can be applied to the above embodiments of the thin film circuit substrates 2, 2a, 2b, 2c and 2d as shown in FIGS. 2J, 3A, 3B, 4A and 4B. The specific technical contents thereof can be referred to the above embodiments, so the detailed descriptions thereof will be omitted.

As mentioned above, in the conventional method for driving an optoelectronic device by thin film transistor, such as driving the LED to emit light by the thin film transistor on the thin film transistor substrate, different thin film processes are needed to be designed for the products in different sizes or functions, and the conventional manufacturing methods adopt expensive thin film transistor processes, photomasks, substrates and materials, which is very unfavorable for the various product requirements. As shown in the above embodiments according to this disclosure, it does not need to design different manufacturing processes, referring to any expensive fabrication, such as thin film transistor processes, photomasks, substrates and materials, for the products in different sizes or functions, and what the manufacturing process of this disclosure needs is to modify the sizes of the thin film circuit substrate and the driving circuit board for matching with each other, in which the process is simpler and the cost is lower. Moreover, the manufacturing process and electronic device of this disclosure has flexibility in applications so as to be suitable for various product requirements.

To sum up, in the electronic device and manufacturing method thereof of this disclosure, at least one first connection pad and a thin film circuit comprising at least one thin film transistor and at least one conductive trace are formed on a substrate, at least one second connection pad is formed on a driving circuit board, and at least one conductive member is formed to cover at least a part of the second connection pad of the driving circuit board and the first connection pad on the substrate. The first and second connection pads faces upwards, and the conductive member joints adjacent first and second connection pads together. To be noted, the conductive member extends from the substrate, on which the first connection pad disposes, to the driving circuit board, which the second connection pad deposes, vice versa, so that the second connection pad is electrically connected with the first connection pad through the conductive member. According to this design, the consideration on manufacturing the electronic device is about the size options of the thin film circuit substrate and the driving circuit board, but not different expensive processes, so that the manufacturing process of this disclosure is simpler and has lower cost. Moreover, this disclosure has flexibility in applications so as to be suitable for various product requirements.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:
1. A manufacturing method of an electronic device, comprising:
  providing a substrate, wherein the substrate comprises a first surface and a second surface opposite to each other;
  forming a thin film circuit on the first surface of the substrate, wherein the thin film circuit comprises at least one thin film transistor and at least one conductive trace;
  forming at least one first connection pad on the first surface of the substrate, wherein the first connection pad is electrically connected with the thin film transistor through the conductive trace;

disposing the second surface of the substrate on a driving circuit board, wherein the driving circuit board comprises at least one second connection pad disposed in an extension direction along the second face of the substrate and adjacently corresponding to the first connection pad; and after forming the second surface of the substrate on the driving circuit board, forming a conductive member by jet printing or coating to partially cover the second connection pad and partially cover the first connection pad, such that the second connection pad is electrically connected with the first connection pad through the conductive member.

2. The manufacturing method of claim 1, wherein the substrate is a rigid board, or a flexible board formed on a rigid carrier.

3. The manufacturing method of claim 2, before the step of disposing the substrate on the driving circuit board, further comprising:

removing the rigid carrier.

4. The manufacturing method of claim 1, after the step of forming the thin film circuit on the substrate, further comprising:

forming a protection layer to cover the thin film circuit.

5. The manufacturing method of claim 1, further comprising:

disposing a surface mounted element on the driving circuit board, wherein the driving circuit board further comprises at least one third connection pad, and the surface mounted element is electrically connected with the thin film transistor through the second connection pad and is electrically connected with the driving circuit board through the third connection pad.

6. The manufacturing method of claim 1, further comprising:

forming at least one fourth connection pad on the first surface of the substrate, wherein the fourth connection pad is electrically connected with the thin film transistor through the conductive trace; and disposing a surface mounted element on the first surface of the substrate, wherein the surface mounted element is electrically connected with the thin film transistor through the fourth connection pad.

7. The manufacturing method of claim 1, further comprising:

forming at least one fourth connection pad on the first surface of the substrate, wherein the fourth connection pad is electrically connected with the thin film transistor through the conductive trace; and disposing at least one functional chip on the first surface of the substrate, wherein the functional chip is electrically connected with the thin film transistor through the fourth connection pad.

8. The manufacturing method of claim 7, further comprising:

forming a protection layer to cover the thin film circuit and the functional chip.

9. The manufacturing method of claim 1, further comprising:

disposing a plurality of the substrates on the driving circuit board in an array, wherein each of the substrates comprises a plurality of the thin film circuits and a plurality of the first connection pads, each of the thin film circuits is electrically connected with corresponding ones of the first connection pads, the driving circuit board comprises a plurality of the second connection pads, a plurality of the conductive members are formed, and one of the first connection pads corresponding to one of the thin film circuits and one of the second connection pads of the driving circuit board are electrically connected through one of the conductive members; and electrically connecting two of the thin film circuits disposed on adjacent two of the substrates through connection among two of the first connection pads, at least one of the second connection pads corresponding to the two first connection pads, and two of the conductive members respectively corresponding to the two first connection pads.

10. The manufacturing method of claim 1, further comprising:

disposing a plurality of the substrates on the driving circuit board in an array, wherein each of the substrates comprises a plurality of the thin film circuits and a plurality of the first connection pads, each of the thin film circuits is electrically connected with corresponding ones of the first connection pads, the driving circuit board comprises a plurality of the second connection pads, a plurality of the conductive members are formed, and one of the first connection pads corresponding to one of the thin film circuits and one of the second connection pads of the driving circuit board are electrically connected through one of the conductive members; and electrically connecting two of the thin film circuits disposed on adjacent two of the substrates through connection among two of the first connection pads, at least one of the second connection pads corresponding to the two first connection pads, and one of the conductive members corresponding the two first connection pads.

11. An electronic device, comprising:

a substrate comprising a first surface and a second surface opposite to each other;

a thin film circuit disposed on the first surface of the substrate, wherein the thin film circuit comprises at least one thin film transistor and at least one conductive trace;

at least one first connection pad disposed on the first surface of the substrate, wherein the first connection pad is electrically connected with the thin film transistor through the conductive trace;

a driving circuit board comprising at least one second connection pad, wherein the second surface of the substrate is disposed on a driving circuit board, and the second connection pad is disposed in an extension direction along the second face of the substrate and adjacently corresponding to the first connection pad; and a conductive member formed by jet printing or coating, after the second surface of the substrate is formed on the driving circuit board, to partially cover the second connection pad and partially cover the first connection pad, such that the second connection pad is electrically connected with the first connection pad through the conductive member.

12. The electronic device of claim 11, wherein the substrate is a rigid board, or a flexible board.

13. The electronic device of claim 11, further comprising: a protection layer covering the thin film circuit.

14. The electronic device of claim 11, further comprising: a surface mounted element disposed on the driving circuit board, wherein the driving circuit board further comprises at least one third connection pad, and the surface mounted element is electrically connected with the thin film transistor through the second connection pad and is electrically connected with the driving circuit board through the third connection pad.

15. The electronic device of claim 11, further comprising:
at least one fourth connection pad disposed on the first surface of the substrate, wherein the fourth connection pad is electrically connected with the thin film transistor through the conductive trace; and
a surface mounted element disposed on the first surface of the substrate, wherein the surface mounted element is electrically connected with the thin film transistor through the fourth connection pad.

16. The electronic device of claim 11, further comprising:
at least one fourth connection pad disposed on the first surface of the substrate, wherein the fourth connection pad is electrically connected with the thin film transistor through the conductive trace; and
at least one functional chip disposed on the first surface of the substrate, wherein the functional chip is electrically connected with the thin film transistor through the fourth connection pad.

17. The electronic device of claim 16, further comprising:
a protection layer covering the thin film circuit and the functional chip.

18. The electronic device of claim 11, wherein a plurality of the substrates are disposed on the driving circuit board in an array, each of the substrates comprises a plurality of the thin film circuits and a plurality of the first connection pads, each of the thin film circuits is electrically connected with corresponding ones of the first connection pads, the driving circuit board comprises a plurality of the second connection pads, a plurality of the conductive members are formed, one of the first connection pads corresponding to one of the thin film circuits and one of the second connection pads of the driving circuit board are electrically connected through one of the conductive members, and two of the thin film circuits disposed on adjacent two of the substrates are electrically connected through connection among two of the first connection pads, at least one of the second connection pads corresponding to the two first connection pads, and two of the conductive members respectively corresponding to the two first connection pads.

19. The electronic device of claim 11, wherein a plurality of the substrates are disposed on the driving circuit board in an array, each of the substrates comprises a plurality of the thin film circuits and a plurality of the first connection pads, each of the thin film circuits is electrically connected with corresponding ones of the first connection pads, the driving circuit board comprises a plurality of the second connection pads, a plurality of the conductive members are formed, one of the first connection pads corresponding to one of the thin film circuits and one of the second connection pads of the driving circuit board are electrically connected through one of the conductive members, and two of the thin film circuits disposed on adjacent two of the substrates are electrically connected through connection among two of the first connection pads, at least one of the second connection pads corresponding to the two first connection pads, and one of the conductive members corresponding the two first connection pads.

* * * * *